US012670940B2

(12) United States Patent
Chaya et al.

(10) Patent No.: US 12,670,940 B2
(45) Date of Patent: Jun. 30, 2026

(54) PREDECODERS WITH WRITE LOGIC BYPASS PATH AND MEMORY STRUCTURE INCLUDING PREDECODERS

(71) Applicant: GlobalFoundries U.S. Inc., Malta, NY (US)

(72) Inventors: Hemavathi Chaya, Bangalore (IN); Nilesh Panchal, Bangalore (IN); H Harish, Andhra Pradesh (IN); Siddharth Gupta, Uttar Pradesh (IN)

(73) Assignee: GlobalFoundries U.S. Inc., Malta, NY (US)

( * ) Notice: Subject to any disclaimer, the term of this patent is extended or adjusted under 35 U.S.C. 154(b) by 128 days.

(21) Appl. No.: 18/901,044

(22) Filed: Sep. 30, 2024

(65) Prior Publication Data

US 2026/0094634 A1    Apr. 2, 2026

(51) Int. Cl.
G11C 8/00 (2006.01)
G11C 8/10 (2006.01)

(52) U.S. Cl.
CPC ..................................... G11C 8/10 (2013.01)

(58) Field of Classification Search
CPC ........................................................ G11C 8/10
USPC .................................................... 365/230.06
See application file for complete search history.

(56) References Cited

U.S. PATENT DOCUMENTS 4,791,615 A   12/1988  Pelley, III et al.
5,491,655 A *  2/1996  Hirose ................... G11C 29/78
                                                          365/207

5,805,523 A    9/1998  Lysinger
5,956,276 A    9/1999  Sredanovic
5,995,430 A * 11/1999  Yabe ........................ G11C 7/10
                                                          365/233.5
6,172,935 B1 * 1/2001  Wright ................ G11C 7/1084
                                                          365/194

(Continued)

FOREIGN PATENT DOCUMENTS

EP            3852109 A1    7/2021
JP         2000076852 A  *  3/2000
JP         2006196177 A  *  7/2006 ............... G11C 7/12

OTHER PUBLICATIONS

European Search Report for corresponding EP Application No. 25162795.6-1211 dated Oct. 8, 2025, 9 pages.

*Primary Examiner* — Viet Q Nguyen
(74) *Attorney, Agent, or Firm* — David Cain; Hoffman Warnick LLC

(57)             ABSTRACT

Disclosed are predecoders and structures including the predecoders. Each predecoder includes, among other components, first and second latches controlled by write and read clock signals, respectively, and a multiplexer-enabled write logic bypass path. During a write, an address signal is latched by the first latch and propagated through logic downstream of the first latch (including through a write logic block) to the second latch (which is transparent). During a read, the write logic bypass path is activated so the address signal bypasses the first latch and the write logic block and is instead propagated only through logic downstream of the write logic block to the second latch (which periodically latches the received signal). In both operations, a predecoded address signal is output but, due to activation of the write logic bypass path during the read, the time between receiving the address signal and outputting the predecoded address signal is reduced.

20 Claims, 4 Drawing Sheets

(56) References Cited

U.S. PATENT DOCUMENTS

| 6,181,635 | B1 |  | 1/2001 | Bae |  |
|---|---|---|---|---|---|
| 6,304,510 | B1 |  | 10/2001 | Nobunaga et al. |  |
| 6,373,783 | B1 | * | 4/2002 | Tomita | G11C 8/18 |
|  |  |  |  |  | 365/194 |
| 6,868,029 | B2 | * | 3/2005 | Ooishi | G11C 11/40622 |
|  |  |  |  |  | 365/222 |
| 6,992,946 | B2 | * | 1/2006 | Ooishi | G11C 11/406 |
|  |  |  |  |  | 365/229 |
| 7,035,152 | B1 | * | 4/2006 | Bae | G11C 29/844 |
|  |  |  |  |  | 365/225.7 |
| 8,422,321 | B2 | * | 4/2013 | Tahara | G11C 11/408 |
|  |  |  |  |  | 365/230.03 |
| 8,811,109 | B2 |  | 8/2014 | Terzioglu et al. |  |
| 8,913,436 | B2 |  | 12/2014 | Sanjeevarao et al. |  |
| 11,302,415 | B2 |  | 4/2022 | Bringivijayaraghavan et al. |  |
| 2022/0392513 | A1 | * | 12/2022 | Choi | G11C 11/413 |

* cited by examiner

PREDECODERS WITH WRITE LOGIC BYPASS PATH AND MEMORY STRUCTURE INCLUDING PREDECODERS

BACKGROUND

The present disclosure relates to memory structures and, more particularly, to embodiments of predecoders and memory structures including predecoders.

Non-volatile memory (NVM) structures can include one or more memory banks and peripheral circuitry for each memory bank including, for example, a column address decoder and a row address decoder. NVM structures can also include a column address predecoder and a row address predecoder. For a given memory operation (e.g., a read or write operation) associated with a particular memory address signal, the memory address signal can be split into column and row portions. In some NVM structures (e.g., in NVM structures that support sector erase operations or the like), each predecoder may include an input address latch, a write logic block, a predecode logic block, and an output buffer connected between an address signal input node and an address signal output node. Optionally, row address decoders may include a redundancy logic block in parallel with the predecode logic between the input address latch and the output buffer. In any case, during both read and write operations, an address signal (i.e., a column address signal or a row address signal, as applicable) received at the address signal input node is typically latched and propagated through the write logic block before downstream processing by any other logic circuitry.

SUMMARY

Disclosed herein are embodiments of a structure (e.g., a predecoder). In some embodiments, the structure can include a multiplexer, which has an input terminal, an additional input terminal, and an output terminal. The input terminal of the multiplexer can be connected to a first signal node. The structure can further include a first latch, which is controlled by a first clock signal (e.g., a write clock signal). The structure can further include a write logic block. The first latch and the write logic block can be connected between the first signal node and the additional input terminal. The structure can further include a predecode logic block and a second latch. The second latch can be controlled by a second clock signal (e.g., a read clock signal), which is different from the first clock signal. Furthermore, the predecode logic block and the second latch can be connected between the output terminal and a second signal node.

In other embodiments, the structure can include a first multiplexer, which has a first input terminal, an additional first input terminal, and a first output terminal. The first input terminal of the first multiplexer can be connected to a first signal node. The structure can further include a first latch, which is controlled by a first clock signal (e.g., a write clock signal). The structure can further include a write logic block. The first latch and the write logic block can be connected between the first signal node and the additional first input terminal of the first multiplexer. The structure can further include a second multiplexer, which has a second input terminal, an additional second input terminal, and a second output terminal. The structure can further include a redundancy logic block, which is connected between the first output terminal of the first multiplexer and the second input terminal of the second multiplexer. The structure can further include a predecode logic block, which is connected between the first output terminal of the first multiplexer and the additional second input terminal of the second multiplexer. The structure can further include a second latch, which is controlled by a second clock signal (e.g., a read clock signal) that is different from the first clock signal. This second latch can be connected between the second output terminal and a second signal node.

Also disclosed herein are embodiments of a memory structure. The memory structure can include an address decoder for a memory bank. The memory structure can further include an address predecoder, which is connected to the address decoder. The address predecoder can include a multiplexer, which has an input terminal, an additional input terminal, and an output terminal. The input terminal of the multiplexer can be connected to a first signal node. The address predecoder can further include a first latch, which is controlled by a first clock signal (e.g., a write clock signal). The structure can further include a write logic block. The first latch and the write logic block can be connected between the first signal node and the additional input terminal. The structure can further include a predecode logic block and a second latch, which is controlled by a second clock signal (e.g., a read clock signal) that is different from the first clock signal. The predecode logic block and the second latch can be connected between the output terminal and a second signal node.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1:
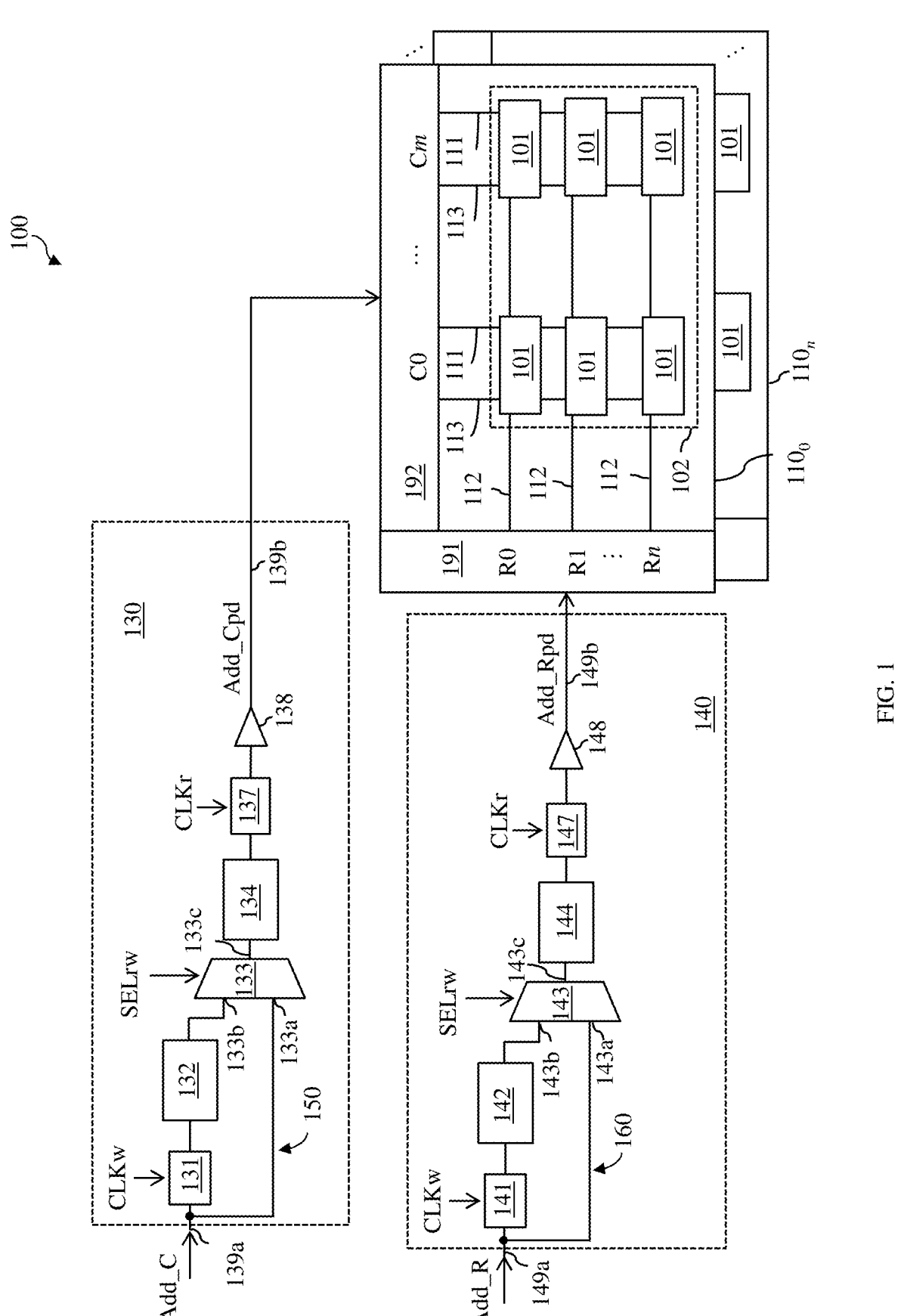
FIG. 1 is a schematic diagram illustrating an embodiment of a memory structure and further illustrating embodiments of column address and row address predecoders.

As mentioned above, NVM structures can include one or more memory banks and peripheral circuitry for each memory bank including, for example, a column address decoder and a row address decoder. NVM structures can also include a column address predecoder and a row address predecoder. For a given memory operation (e.g., a read or write operation) associated with a particular memory address, the memory address signal can be split into column and row portions. In some NVM structures (e.g., in NVM structures that support sector erase operations or the like), each predecoder may include an input address latch, a write logic block, a predecode logic block, and an output buffer connected between an address signal input node and an address signal output node. Optionally, row address decoders may also include a redundancy logic block in parallel with the predecode logic between the input address latch and the output buffer. In any case, during both read and write operations, an address signal (i.e., a column address signal or a row address signal, as applicable) received at the address signal input node is typically latched and then propagated through the write logic block before being processed by any downstream logic circuitry. However, propagation of the address signal through the write logic block is not required for read operations, and thus delays read operation setup time.

In view of the foregoing, disclosed herein are embodiments of predecoders (e.g., column address predecoders and row address predecoders) specifically configured to reduce setup times particularly during read operations. In addition to some conventional predecoder components (e.g., a write logic block, a predecode logic block, and an optional redundancy logic block in the case of a row address predecoder, as discussed above), the predecoders disclosed herein can include first and second latches (also referred to herein as input and output latches) controlled by different write and read clock signals, respectively, and a multiplexer-enabled write logic bypass path. During a write operation, an address signal received at an input node can be latched by the first latch (as a function of a logic 1 state of the write clock signal) and further propagated through logic downstream of the first latch (including through the write logic block, a predecode logic block, and, in the case of row address predecoder, a redundancy logic block) to the second latch (which is transparent as a function of a logic 0 state of the read clock signal). As a result, a predecoded address signal is output at an output node. During a read operation, the write logic bypass path is activated so that an address signal received at the input node bypasses both the first latch and the write logic block and is instead propagated only through logic downstream of the write logic block (the predecode logic block and, in the case of the row address predecoder, a redundancy logic block) to the second latch (which periodically latches the predecoded address signal as a function of periodic transitions of the read clock signal). Since, during the read operations, processing by the write logic block is bypassed altogether and address signal predecoding is performed before the second latch is opened by the read clock signal, the setup time between receiving the address signal at the input node to outputting the predecoded address signal at the output node is significantly reduced compared to the setup time typically seen in prior art predecoders where only a single input address latch is included upstream of all logic blocks. Thus, the read cycle time is also significantly reduced over such prior art predecoders. Also disclosed herein are embodiments of a memory structure (e.g., a NVM structure) including such predecoders.

Figure 2:
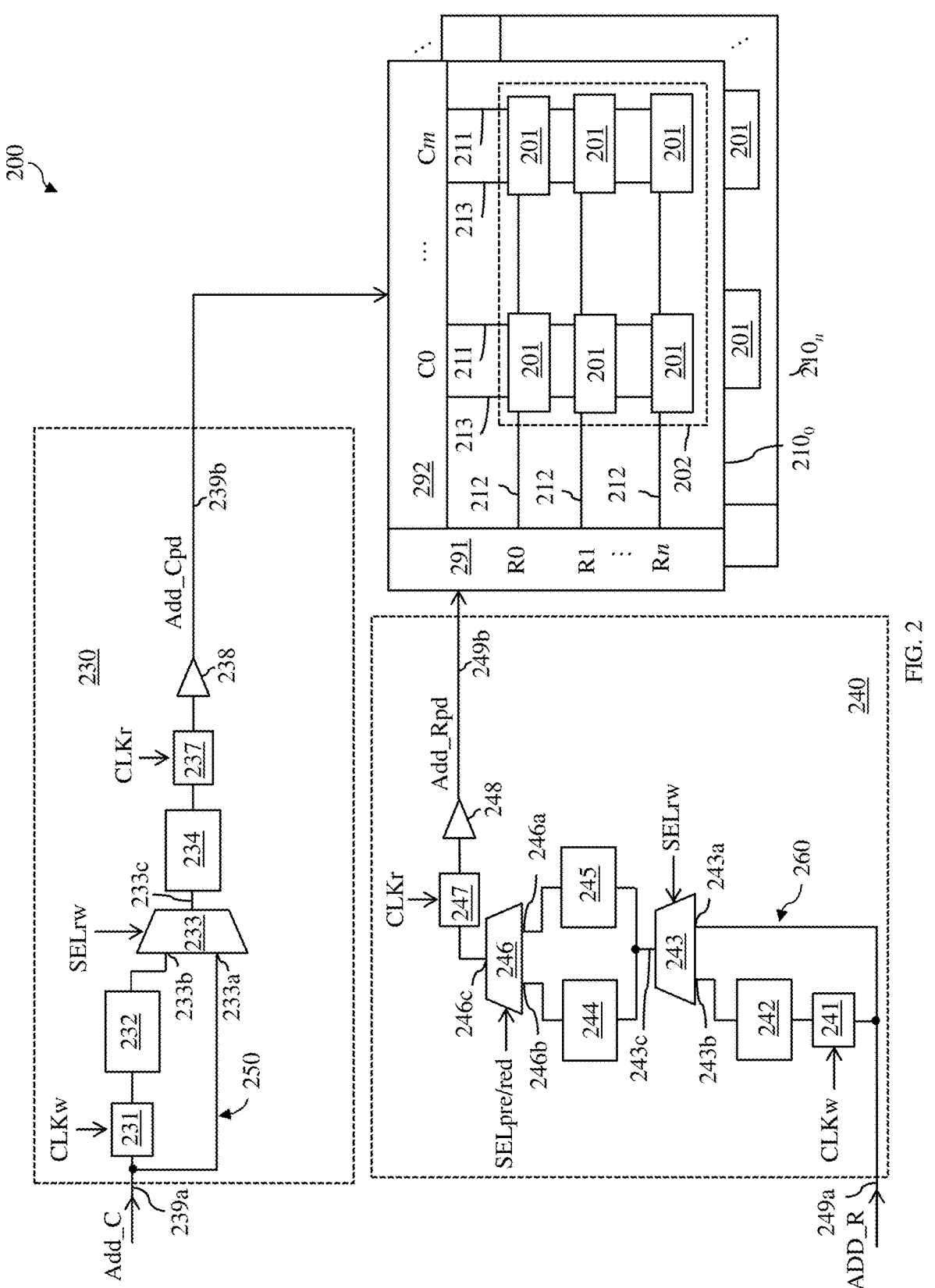
FIG. 2 is a schematic diagram illustrating another embodiment of a memory structure and further illustrating embodiments of column address and row address predecoders.

More particularly, FIGS. 1-2 are schematic diagram illustrating embodiments of a memory structure 100, 200 and further illustrating embodiments of column address predecoders 130, 230 and row address predecoders 140, 240 incorporated into memory structures 100, 200.

Memory structure 100, 200 can include one or more memory banks $110_0$-$110_n$, $210_0$-$210_n$ (hereinafter referred to as banks). Each bank $110_0$-$110_n$, $210_0$-$210_n$ can include an array of memory cells 101, 201 (hereinafter referred to as cells). Cells 101, 201 can be, for example, non-volatile memory (NVM) cells such that memory structure 100, 200 is an NVM structure. In any case, cells 101, 201 can be arranged in columns (e.g., see columns C0-Cm) and rows (e.g., see rows R0-Rn). In some embodiments, the total number of columns can be, for example, one hundred and twenty-eight (i.e., m+1=128). For purposes of illustration, the columns are shown on the drawing sheet as being oriented in the Y-direction (i.e., from top to bottom) and the rows are shown on the sheet as being oriented in the X-direction (i.e., from side to side). The orientation of the columns and rows of cells 101, 201 as shown in the figures is not intended to be limiting. Alternatively, the columns could be oriented in the X-direction and the rows could be oriented in the Y-direction. In any case, the columns can be essentially perpendicular to the rows with each cell 101, 201 being at an address within the memory bank at an intersection between one column and one row. In some embodiments, each bank $110_0$-$110_n$, $210_0$-$210_n$ can be organized into multiple sectors. Each sector can include some number of sequential rows. For example, in some embodiments, each sector could include four sequential rows with one-hundred and twenty-eight cells (corresponding to the total number of columns). In this case, sector 0 could include R0/C0-C127, R1/C0-C127, R2/C0-C127, and R3/C0-C12; sector 1 could include R4/C0-C127, R5/C0-C127, R6/C0-C127, and R7/C0-C127; and so on. Memory structure 100, 200 can further include peripheral circuitry associated with bank(s) $110_0$-$110_n$, $210_0$-$210_n$. For each bank, the peripheral circuitry can include a column control block, which at least includes a column address decoder 192, 292, and a row control block, which at least includes a row address decoder 191, 291.

As mentioned above, cells 101, 201 can be NVM cells. Each bank $110_0$-$110_n$, $210_0$-$210_n$ can include bitlines 111, 211 and source line 113, 213 for the columns C0-Cm, respectively, and each bitline 111, 211 and, optionally, each source line 113, 213 can be connected to the column address decoder 192, 292 for that bank. Each bank $110_0$-$110_n$, $210_0$-$210_n$ can also include wordlines 112, 212 for the rows R0-Rn, respectively, and each wordline 112, 212 can be connected to the row address decoder 191, 291 for that bank. Furthermore, within each bank $110_0$-$110_n$, $210_0$-$210_n$ all cells 101, 201 in a column can be electrically connected between a source line 113, 213 and a bitline 111, 211 for that column. All cells 101, 201 in a row can be electrically connected to the wordline 112, 212 for that row.

Figure 3:
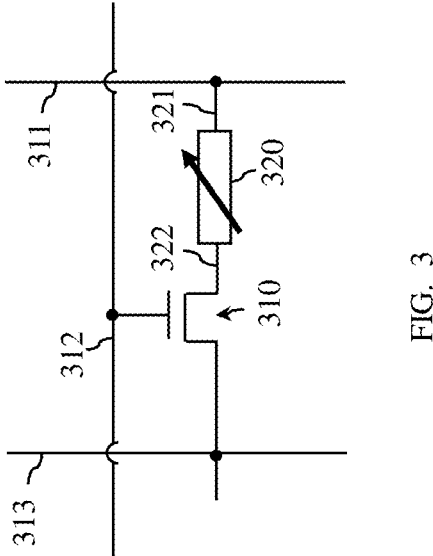
FIG. 3 is a schematic diagram illustrating an example NVM cell structure that could be employed in memory bank(s) of the memory structures of FIG. 1 or FIG. 2.

FIG. 3 is a schematic diagram illustrating an example NVM cell structure that could be employed in bank(s) $110_0$-$110_n$, $210_0$-$210_n$. This NVM cell includes a programmable resistor 320 (also referred to herein as a variable resistor, memristor, and/or other terms for similar components) and an access transistor 310 connected in series between a bitline 311 for a column and a source line 313 for the same column. Specifically, programmable resistor 320 can have a first terminal 321 connected to the bitline 311 for the column and a second terminal 322 connected to the drain region of access transistor 310. Access transistor 310 can be, for example, an N-type field effect transistor (NFET) with a source region can be connected to the source line 313 for the column and with a gate connected to a wordline 312 for the row. In such a resistance-programmable NVM cell, programmable resistor 320 can be any type of programmable resistor suitable for use in a resistive NVM cell. For example, programmable resistor 320 could be a magnetic tunnel junction (MTJ)-type programmable resistor (for a magnetic random access memory (MRAM) cell), a phase change memory (PCM)-type programmable resistor (for a PCM cell), or a resistive random access memory (RRAM)-type programmable resistor (for an RRAM cell) or any other suitable type of programmable resistor that is configured so that, by applying specific bias conditions to one or both of the two terminals, the resistance of programmable resistor 320 can be changed between at least two different stable resistance states. For example, the resistance state of such a programmable resistor 320 can be changed to a high resistance state to store one logic value (e.g., a logic value of "1") or to a low resistance state to store a different logic value (e.g., a logic value of "0"). It should be noted that in some NVM structures source lines are continuously discharged to ground and programming is achieved through bitline biasing. In other NVM structures programming can be achieved through a combination of bitline and source line biasing. In any case, NVM cells including access transistors and programmable resistors, such as MTJ-type programmable resistors, PCM-type programmable resistors, and RRAM-type programmable resistors are known in the art. Thus, a more detailed description of such NVM cells has been omitted from this specification in order to allow the reader to focus on the salient aspects of the disclosed embodiments (e.g., related to the novel components of predecoders discussed in greater detail below).

Memory structure 100, 200 can further include global control circuitry, which is connected to the peripheral circuitry of each bank $110_0$-$110_n$, $210_0$-$210_n$. The global control circuitry can include, but is not limited to, a column address predecoder 130, 230 connected to column address decoders 192, 292 and a row address predecoder 140, 240 connected to row address decoders 191, 291. It should be noted that column address predecoder 130 of memory structure 100 and column address predecoder 230 of memory structure 200 are essentially the same. However, the row address predecoder 240 of memory structure 200 is modified over the row address predecoder 140 of memory structure 200 to include an optional redundancy logic block 245.

Referring to FIGS. 1 and 2, generally, column address predecoder 130, 230 can be connected to receive a column address signal (Add_C) portion of a particular memory address signal from a memory controller (not shown) at a first signal node 139a, 239a (referred to herein as a column address input node) and can output a predecoded column address signal (Add_Cpd) at a second signal node 139b, 239b (referred to herein as a predecoded column address output node). A predecoded column address signal (also referred to herein as a partially decoded column address signal or an intermediate column address signal) refers to a column address signal that has been partially decoded by column address predecoder 130, 230 (e.g., to indicate a particular bank and column therein for a memory operation) before receipt and processing by a column address decoder 192, 292. Similarly, row address predecoder 140, 240 can be connected to receive a row address signal (Add_R) portion of a particular memory address signal from a memory controller (not shown) at a first signal node 149a, 249a (referred to herein as a row address input node) and can output a predecoded row address signal (Add_Rpd) at a second signal node 149b, 249b (referred to herein as a predecoded row address output node). A predecoded row address signal (also referred to herein as a partially decoded row address signal or an intermediate column address signal) refers to a row address signal that has been partially decoded by row address predecoder 140, 240 (e.g., to indicate a particular bank and row therein for a memory operation) before receipt and processing by a row address decoder 191, 291.

More particularly, column address predecoder 130, 230 and row address predecoder 140, 240 can include some conventional predecoder components. For example, column address predecoder 130, 230 and row address predecoder 140, 240 can each include a write logic block (see column address write logic block 132, 232 and row address write logic block 142, 242) and a predecode logic block (see column address predecode logic block 134, 234 and row address predecode logic block 144, 244. Optionally, row address predecoder 140, 240 can also include redundancy logic block (e.g., see redundancy logic block 245 in row address predecoder 240 of memory structure 200 of FIG. 2 only).

Write logic blocks can include logic circuitry specifically configured to facilitate write operations. For example, these write logic blocks can include, but are not limited to, address counters. As mentioned above, in some embodiments each bank can be divided into sectors. Each sector can include some number of sequential rows. For example, each sector could include four sequential rows and each row could include one hundred and twenty-eight cells (corresponding to the total number of columns). In this case, sector 0 could include R0/C0-C127, R1/C0-C127, R2/C0-C127, and R3/C0-C12; sector 1 could include R4/C0-C127, R5/C0-C127, R6/C0-C127, and R7/C0-C127; and so on. To facilitate performance of automatic write operations with respect to all memory cells in a sector in sequence upon receipt of a memory address associated with a first cell in the sector without having to receive each individual memory address, the column address predecoder 130, 230 and the row address predecoder 140, 240 (as discussed in greater detail below can include write logic blocks with address counters) could be configured to automatically increment the column and row addresses until all cells in the sector have been written to. That is, column address counter of write logic block 132, 232 can be configured to increment column addresses from C0 to Cm for each row address, while row address counter of write logic block 142, 242 can be configured to increment row addresses after each m+1 write cycles. For example, for a second including four rows of one hundred and twenty-eight cells, column address counter of write logic block 132, 232 can be configured to increment column addresses from C0 to C127 for each row address (starting with the initial row in the sector and ending with the last row in the sector), while row address counter of write logic block 142, 242 can be configured to increment row addresses after each one hundred and twenty-eight write cycles. Such write logic blocks are known in the art and, thus, more specific details thereof have been omitted from the specification in order to allow the reader to focus on salient aspects of the disclosed embodiments (e.g., related to the novel components of predecoders discussed in greater detail below).

Predecode logic blocks can include logic circuity configured to predecode (or partially decode) a received address signal. Specifically, a received memory address can include information indicative of a memory cell location to be accessed during a read or write operation. However, the information may indicate a memory cell location within the memory structure as a whole and not within a given bank therein. For example, memory structure 100, 200 as a whole may include a relatively large number of columns and a relatively large number of rows. The columns and/or rows may be partitioned, thereby forming banks $110_0$-$110_n$, $210_0$-$210_n$ (e.g., each having the same number of columns and the same number of rows). Column address and row address signals received by the column address predecoder 130, 230 and row address predecoder 140, 240, respectively, may be associated with memory structure 100, 200 as a whole (before partitioning). Column address predecode logic block 134, 234 can be configured to predecode Add_C such that Add_Cpd indicates a specific bank and column therein. Similarly, row address predecode logic block 144, 244 can be configured to predecode Add_R such that Add_Rpd indicates a specific bank and row therein. Such predecode logic blocks are known in the art and, thus, more specific details thereof have been omitted from the specification in order to allow the reader to focus on salient aspects of the disclosed embodiments (e.g., related to the novel components of predecoders discussed in greater detail below).

A redundancy logic block can, optionally, be included in a row address predecoder (e.g., see redundancy logic block 245 in row address predecoder 240 of memory structure 200 of FIG. 2). Such a redundancy logic block 245 can be configured to enable a row redundancy scheme. For example, in memory structure 200, performance can be improved through the use of one or more redundant rows of cells 201 (also referred to as spare or secondary rows) so that, if/when one or more cells in a primary row in a bank is/are determined to be defective, a redundant row (in the same or a different bank) can be used, thereby avoiding memory failures. To implement a redundancy scheme, defective row information can be stored in a defective row memory (e.g., a fused-based memory) and row redundancy logic block 245 (also referred to herein as a row redundancy control circuit) can be configured to determine whether or not to use a primary row (as indicated by the received row address signal) or one of the redundant rows, based on this defective row information, and can output the appropriate signals to make that happen. Such row redundancy logic blocks are known in the art and, thus, more specific details thereof have been omitted from the specification in order to allow the reader to focus on salient aspects of the disclosed embodiments (e.g., related to the novel components of predecoders discussed in greater detail below).

As mentioned above, in some NVM structures (e.g., in NVM structures that support sector erase or the like), in the column address predecoders and in the row address predecoders, the received address signal (i.e., a column address signal or a row address signal, as applicable) may be latched by an input address latch and then propagated through the write logic block during any type of memory operation (i.e., during both write and read operations). However, propagation of the address signal through the write logic block is not required for read operations and, thus, results in unnecessary delay in read operation setup time. In order to avoid this unnecessary added setup time delay during read operations, the disclosed predecoder embodiments each include a combination of first and second latches (also referred to herein as input and output latches) controlled by different write and read clock signals, respectively, and a multiplexer-enabled write logic bypass path. In these embodiments, during the read operations, processing by a write logic block is bypassed altogether and address signal predecoding is performed before the second latch is opened by a read clock signal. Thus, the setup time between receiving an address signal to outputting a predecoded address signal is significantly reduced during a read operation as compared to the setup time typically seen in prior art predecoders where only a single input address latch is included upstream of all logic blocks. Thus, the read cycle time is also significantly reduced over such conventional predecoders.

More specifically, referring to FIGS. 1 and 2, column address predecoder 130, 230 of memory structure 100, 200 can include a first signal node 139a, 239a (also referred to herein as a column address input node), which is connected to receive Add_C. Column address predecoder 130, 230 can further include a second signal node 139b, 239b (also referred to herein as a predecoded column address output node) for outputting Add_Cpd. Between first signal node 139a, 239a and second signal node 139b, 239b, column address predecoder 130, 230 can further include a multiplexer 133, 233. Multiplexer 133, 233 can include two input terminals: one input terminal 133a, 233a connected to first signal node 139a, 239a; and an additional input terminal 133b, 233b. Multiplexer 133, 233 can further include an output terminal 133c, 233c.

Column address predecoder 130, 230 can further include a first latch 131, 231 (also referred to herein as a column address input latch), which is controlled by a first clock signal (also referred to herein as a write clock signal (CLKw)), and a column address write logic block 132, 232 (e.g., including a column address counter, as discussed in above). First latch 131, 231 and write logic block 132, 232 can be series-connected between first signal node 139a, 239a and additional input terminal 133b, 233b of multiplexer 133, 233.

Column address predecoder 130, 230 can further include a column address predecode logic block 134, 234 (as discussed in greater detail above) and a second latch 137 (also referred to herein as a predecoded column address output latch), which are series-connected between output terminal 133c, 233c of multiplexer 133, 233 and second signal node 139b, 239b. Second latch 137, 237 can be controlled by a second clock signal (also referred to herein as a read clock signal (CLKr)). Optionally, column address predecoder 130, 230 can further include an output buffer 138, 238, which is series-connected between second latch 137, 237 and second signal node 139b, 239b.

Referring specifically to memory structure 100 of FIG. 1, row address predecoder 140 can be configured similarly to column address predecoder 130. That is, row address predecoder 140 can include a first signal node 149a (also referred to herein as a row address input node), which is connected to receive Add_R. Row address predecoder 140 can further include a second signal node 149b (also referred to herein as a predecoded row address output node) for outputting Add_Rpd. Between first signal node 149a and second signal node 149b, row address predecoder 140 can further include a multiplexer 143. Multiplexer 143 can include two input terminals: one input terminal 143a connected to first signal node 149a; and an additional input terminal 143b. Multiplexer 143 can also include an output terminal 143c.

Row address predecoder 140 can further include a first latch 141 (also referred to herein as a row address input latch), which is controlled by CLKw and a row address write logic block 142 (e.g., including a row address counter, as discussed above). First latch 141 and write logic block 142 can be series-connected between first signal node 149a and additional input terminal 143b of multiplexer 143.

Row address predecoder 140 can further include a row address predecode logic block 144 (as discussed in greater detail above) and a second latch 147 (also referred to herein as a predecoded row address output latch), which are series-connected between output terminal 143c of multiplexer 143 and second signal node 149*b*. Second latch 147 can be controlled by CLKr. Optionally, row address predecoder 140 can further include an output buffer 148, which is series-connected between second latch 147 and second signal node 149*b*.

Referring specifically to memory structure 200 of FIG. 2, row address predecoder 240 can be somewhat more complex than row address predecoder 140 in that it also incorporates a redundancy logic block 245 (as discussed in greater detail below). In this case, row address predecoder 240 can include a first signal node 249*a* (also referred to herein as a row address input node), which is connected to receive Add_R. Row address predecoder 240 can further include a second signal node 249*b* (also referred to herein as a predecoded row address output node) for outputting Add_Rpd. Between first signal node 249*a* and second signal node 249*b*, row address predecoder 240 can further include a first multiplexer 243. First multiplexer 243 can include two first input terminals: one first input terminal 243*a* connected to first signal node 249*a*; and an additional first input terminal 243*b*. First multiplexer 243 can further include a first output terminal 243*c*.

Row address predecoder 240 can further include a first latch 241 (also referred to herein as a row address input latch), which is controlled by CLKw and a row address write logic block 242 (e.g., including a row address counter, as discussed above). First latch 241 and write logic block 242 can be series-connected between first signal node 249*a* and additional first input terminal 243*b* of first multiplexer 243.

Row address predecoder 240 can further include a second multiplexer 246. Second multiplexer 246 can have two second input terminals (i.e., a second input terminal 246*a* and an additional second input terminal 246*b*) and a second output terminal 246*c*. Second multiplexer 246 can be controlled, for example, by predecode/redundancy select signal (SELpre/red). Row address predecoder 240 can further include a redundancy logic block 245 and a row address predecode logic block 244 (as discussed in greater detail above). Redundancy logic block 245 can be connected between first output terminal 243*c* of first multiplexer 243 and second input terminal 246*a* of second multiplexer 246. Predecode logic block 244 can be connected between first output terminal 243*c* of first multiplexer 243 and additional second input terminal 246*b* of second multiplexer 246. Thus, redundancy logic block 245 and predecode logic block 244 are connected in parallel between first multiplexer 243 and second multiplexer 246.

Row address predecoder 240 can further include a second latch 247, which is connected between second output terminal 246*c* of second multiplexer 246 and a second signal node 249*b*. Second latch 247 can be controlled by CLKr. Optionally, row address predecoder 240 can further include an output buffer 248, which is series-connected between second latch 247 and second signal node 249*b*.

Referring again to FIGS. 1 and 2 in combination, in column address predecoder 130, 230 and row address predecoder 140, 240, multiplexers 133, 233 and 143, 243 can be controlled by the same read/write select signal (SELrw). SELrw can be switchable to cause multiplexers 133, 233 and 143, 243 to connect only one of two input terminals thereof to the output terminal, depending upon whether a write operation or a read operation is to be performed.

For example, consider column address predecoder 130 shown in FIG. 1 or 230 shown in FIG. 2. During a write operation, SELrw can switch to a first state to cause multiplexer 133, 233 to connect additional input terminal 133*b*, 233*b* (and thereby write logic block 132, 232) to output terminal 133*c*, 233*c* (and thereby to predecode logic block 134, 234). However, during a read operation, SELrw can switch to a second state to cause multiplexer 133, 233 to connect input terminal 133*a*, 233*a* (and thereby first signal node 139*a*, 239*a*) to output terminal 133*c*, 233*c* (and thereby to predecode logic block 134, 234). Thus, in the read operation, a write logic bypass path 150, 250 (also referred to herein as a multiplexer-enabled write logic bypass path) is created to supply Add_C to predecode logic block 134, 234 without passing through first latch 131, 231 or write logic block 132, 232 to reduce the read operation setup time.

Also consider row address predecoder 140 shown in FIG. 1. During a write operation, SELrw can switch to the first state to cause multiplexer 144 to connect additional input terminal 143*b* (and thereby write logic block 142) to output terminal 143*c* (and thereby to predecode logic block 144). However, during a read operation, SELrw can switch to the second state to cause multiplexer 143 to connect input terminal 143*a* (and thereby first signal node 149*a*) to output terminal 143*c* (and thereby to predecode logic block 144). Thus, in the read operation, a write logic bypass path 160 is created to supply Add_R to predecode logic block 144 without passing through first latch 141 or write logic block 142 to reduce the read operation setup time.

Also consider row address predecoder 240 shown in FIG. 2. During a write operation, SELrw can switch to the first state to cause first multiplexer 243 to connect additional first input terminal 243*b* (and thereby write logic block 242) to first output terminal 243*c* (and thereby to both predecode logic block 244 and redundancy logic block 245). However, during a read operation, SELrw can switch to the second state to cause first multiplexer 243 to connect first input terminal 243*a* (and thereby first signal node 249*a*) to first output terminal 243*c* (and thereby to predecode logic block 244 and redundancy logic block 245). Thus, in the read operation, a write logic bypass path 260 (also referred to herein as a multiplexer-enabled write logic bypass path) is created to supply Add_R to predecode logic block 244 and redundancy logic block 245 without passing through first latch 241 or write logic block 242 to reduce the read operation setup time. In this case, the output from first multiplexer 243 is propagated through both redundancy logic block 245 and predecode logic block 244 to the two second input terminals 246*a*-246*b* of second multiplexer. Second multiplexer 246 can be controlled, for example, by predecode/redundancy select signal (SELpre/red). SELpre/red can be switchable to cause second multiplexer 246 to connect either second input terminal 246*a* or additional second input terminal 246*b* to second output terminal 246*c* (i.e., to either disable or enable the redundancy scheme). That is, if redundancy is disabled, SELrw can switch to a first state to cause second multiplexer 246 to connect additional second input terminal 246*b* (and thereby predecode logic block 244) to second output terminal 246*c* (and thereby to second latch 247). However, if redundancy is enabled, SELpre/red can switch to a second state to cause second multiplexer 246 to connect second input terminal 246*a* (and thereby redundancy logic block 245) to second output terminal 246*c* (and thereby to second latch 237).

Figures 4A, 4B:
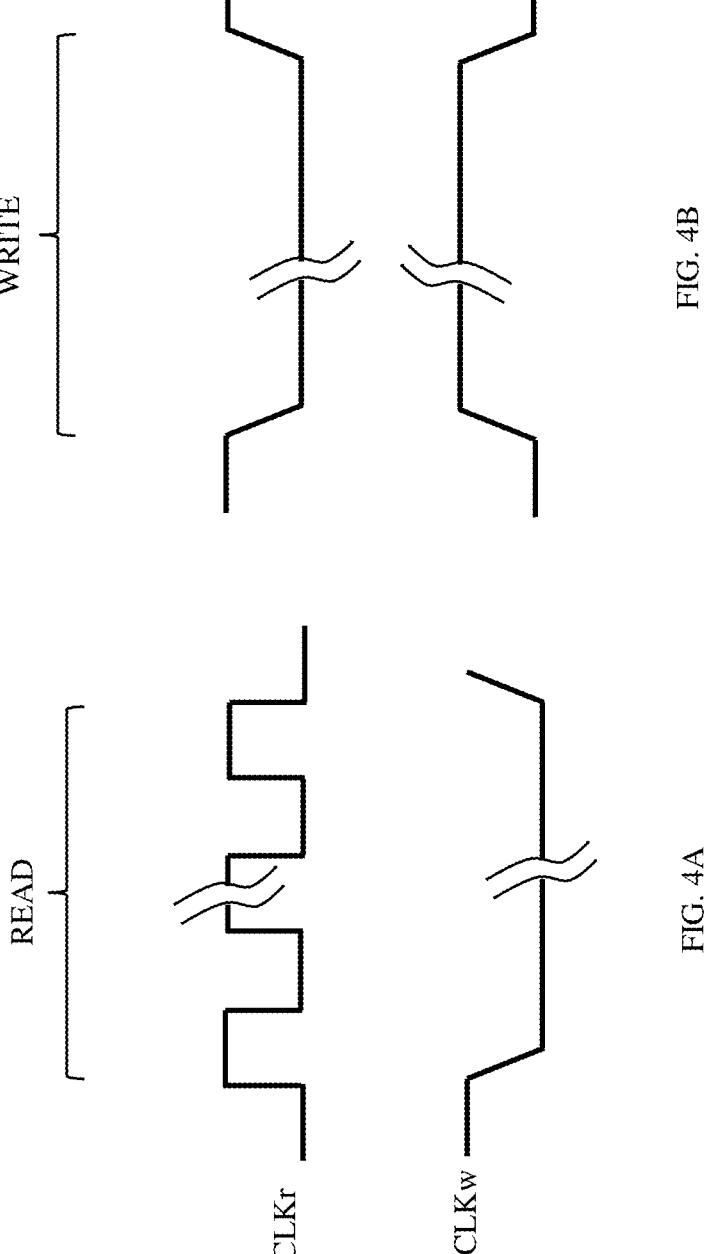
FIG. 4A is a timing diagram illustrating example read and write clock signals employed by predecoders in the memory structures of FIG. 1 or FIG. 2 during a read operation.
FIG. 4B is a timing diagram illustrating example read and write clock signals employed by predecoders in the memory structures of FIG. 1 or FIG. 2 during a write operation.

As mentioned above, in each of the predecoders 130, 140, 230, 240 described in detail above and illustrated in FIGS. 1 and 2, the first latch 131, 141, 231, 241 is controlled by a first clock signal and, particularly, a write clock signal (CLKw) and the second latch 137, 147, 237, 247 is controlled a second clock signal and, particularly, a read clock signal (CLKr). CLKw and CLKr can be asynchronous clock signals that vary depending upon whether a read operation or a write operation is being performed. FIG. 4A is an example timing diagram illustrating CLKw and CLKr during a read operation. As illustrated, CLKw goes low (e.g., to a logic 0) during the read operation so first latch 131, 141, 231, 241 is transparent. That is, during the read operation, the output from first latch 131, 141, 231, 241 transparently follows the input with some small delay. CLKr becomes periodic (e.g., with a fixed period between low and high levels) and, thus, latches the predecoded address signal output to output buffer 138, 148, 238, 248 and thereby to second signal node 139*b*, 149*b*, 239*b*, 249*b* as a function of the transitions of CLKr. FIG. 4B is an example timing diagram illustrating CLKw and CLKr during a write operation. As illustrated, CLKw goes high (e.g., to a logic 1) during the write operation to latch the input address signal. CLKr goes low (e.g., to a logic 0) during the write operation so second latch 137, 147, 237, 247 is transparent. That is, during the write operation, output from second latch 137, 147, 237, 247 transparently follows the input with some small delay.

In the embodiments described above and illustrated in FIGS. 1 and 2, multiplexer-enabled logic bypass paths 150, 160, 250, 260 with predecoders 130, 140, 230, 240 effectively reduce the turn-around-time, during read operations, between receiving an address signal at an input node to outputting a predecoded address signal at an output node. Furthermore, disclosed embodiments achieve this performance benefit with only a minimal increase (e.g., less than 1%) in area and essentially no impact on leakage or dynamic power because the added logic for implementation is present within nonrepeating global control circuitry.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a multiplexer including: an input terminal connected to a first signal node; an additional input terminal; and an output terminal;
   a first latch controlled by a first clock signal;
   a write logic block, wherein the first latch and the write logic block are connected between the first signal node and the additional input terminal;
   a predecode logic block; and
   a second latch controlled by a second clock signal different from the first clock signal, wherein the predecode logic block and the second latch are connected between the output terminal and a second signal node.

2. The structure of claim 1, wherein the multiplexer is controlled by a select signal and wherein the select signal causes the multiplexer to connect the predecode logic block to one of the first signal node and the write logic block.

3. The structure of claim 2,
   wherein the first signal node receives an address signal, and
   wherein the select signal causes the multiplexer to connect the predecode logic block to the write logic block during a write operation and further causes the multiplexer to connect the predecode logic block to the first signal node during a read operation in order to create a multiplexer-enabled write logic bypass path for the address signal during the read operation.

4. The structure of claim 3, wherein the address signal is a row address signal and wherein the second signal node outputs a predecoded row address signal to row address decoders of memory banks.

5. The structure of claim 3, wherein the address signal is a column address signal and wherein the second signal node outputs a predecoded column address signal to column address decoders of memory banks.

6. The structure of claim 1, wherein, during a read operation, the first clock signal switches to logic 0 causing the first latch to be transparent and the second clock signal is periodic, and wherein, during a write operation, the second clock signal switches to a logic 0 causing the second latch to be transparent and the first clock signal switches to a logic 1.

7. The structure of claim 1, further comprising an output buffer connected between the second latch and the second signal node.

8. A structure comprising:

a first multiplexer having a first input terminal connected to a first signal node; an additional first input terminal; and a first output terminal;

a first latch controlled by a first clock signal;

a write logic block, wherein the first latch and the write logic block are connected between the first signal node and the additional first input terminal;

a second multiplexer having a second input terminal; an additional second input terminal;

and a second output terminal;

a redundancy logic block connected between the first output terminal and the second input terminal;

a predecode logic block connected between the first output terminal and the additional second input terminal; and a second latch controlled by a second clock signal different from the first clock signal, wherein the second latch is connected between the second output terminal and a second signal node.

9. The structure of claim 8, wherein the first multiplexer is controlled by a first select signal and wherein the first select signal causes the first multiplexer to connect the redundancy logic block and the predecode logic block to one of the first signal node and the write logic block.

10. The structure of claim 9, wherein the first signal node receives a row address signal, and wherein the first select signal causes the first multiplexer to connect the redundancy logic block and the predecode logic block to the write logic block during a write operation and further causes the first multiplexer to connect the redundancy logic block and the predecode logic block to the first signal node during a read operation in order to create a multiplexer-enabled write logic bypass path for the row address signal during the read operation.

11. The structure of claim 10, wherein the second multiplexer is controlled by a second select signal and wherein the second select signal causes the second multiplexer to connect the second latch to one of the redundancy logic block and the predecode logic block.

12. The structure of claim 10, wherein the second signal node outputs a predecoded row address signal to row address decoders of memory banks.

13. The structure of claim 8, wherein, during a read operation, the first clock signal switches to logic 0 causing the first latch to be transparent and the second clock signal is periodic, and wherein, during a write operation, the second clock signal switches to a logic 0 causing the second latch to be transparent and the first clock signal switches to a logic 1.

14. The structure of claim 8, further comprising an output buffer connected between the second latch and the second signal node.

15. A structure comprising:

an address decoder for a memory bank; and an address predecoder connected to the address decoder and including:

a multiplexer including: an input terminal connected to a first signal node; an additional input terminal; and an output terminal;

a first latch controlled by a first clock signal;

a write logic block, wherein the first latch and the write logic block are connected between the first signal node and the additional input terminal;

a predecode logic block; and a second latch controlled by a second clock signal different from the first clock signal, wherein the predecode logic block and the second latch are connected between the output terminal and a second signal node.

16. The structure of claim 15, wherein the multiplexer is controlled by a select signal and wherein the select signal causes the multiplexer to connect the predecode logic block to one of the first signal node and the write logic block.

17. The structure of claim 16, wherein the address decoder is a column address decoder, wherein the address predecoder is a column address predecoder, wherein the first signal node receives a column address signal, wherein the select signal is causes the multiplexer to connect the predecode logic block to the write logic block during a write operation and further causes the multiplexer to connect the predecode logic block to the first signal node during a read operation in order to create a write logic bypass path for the address signal during the read operation, and wherein the second signal node outputs a predecoded column address signal to the column address decoders.

18. The structure of claim 17, further comprising: a row address decoder for the memory bank; and a row address predecoder connected to the row address decoder, wherein the row address predecoder includes at least: two latches controlled by the first clock signal and the second clock signal, respectively; a multiplexer; and write and predecode logic blocks with a multiplexer-enabled write logic bypass path for read operations.

19. The structure of claim 17, further comprising: a row address decoder for the memory bank; and a row address predecoder connected to the row address decoder, wherein the row address predecoder includes at least: two latches controlled by the first clock signal and the second clock signal, respectively; two multiplexers; and write, predecode, and redundancy logic blocks with a multiplexer-enabled write logic bypass path for read operations.

20. The structure of claim 15, wherein, during a read operation, the first clock signal switches to logic 0 causing the first latch to be transparent and the second clock signal is periodic, and wherein, during a write operation, the second clock signal switches to a logic 0 causing the second latch to be transparent and the first clock signal switches to a logic 1.

* * * * *